(12) United States Patent
Kibbel et al.

(10) Patent No.: US 6,670,544 B2
(45) Date of Patent: Dec. 30, 2003

(54) SILICON-GERMANIUM SOLAR CELL HAVING A HIGH POWER EFFICIENCY

(75) Inventors: Horst Kibbel, Erbach (DE); Ulf Koenig, Ulm (DE); Johannes Konle, Voehringen (DE); Hartmut Presting, Blaustein (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 10/008,631

(22) Filed: Dec. 6, 2001

(65) Prior Publication Data

US 2002/0112755 A1 Aug. 22, 2002

(30) Foreign Application Priority Data

Dec. 8, 2000 (DE) .......................................... 100 61 192

(51) Int. Cl.$^7$ ...................... H01L 31/0352; H01L 31/04
(52) U.S. Cl. ...................... 136/261; 136/255; 136/249; 257/461; 257/14; 257/15; 438/57
(58) Field of Search ................. 136/255, 249, 136/261; 257/461, 14, 15; 438/57

(56) References Cited

U.S. PATENT DOCUMENTS

| | | | | |
|---|---|---|---|---|
| 4,542,256 A | * | 9/1985 | Wiedeman | 136/249 |
| 4,598,164 A | * | 7/1986 | Tiedje et al. | 136/249 |
| 5,886,361 A | * | 3/1999 | Presting et al. | 257/17 |
| 6,043,517 A | * | 3/2000 | Presting et al. | 257/184 |
| 6,060,656 A | * | 5/2000 | Dresselhaus et al. | 136/205 |
| 6,342,720 B1 | * | 1/2002 | Presting et al. | 257/440 |
| 6,444,897 B1 | * | 9/2002 | Luque-Lopez et al. | 136/255 |

FOREIGN PATENT DOCUMENTS

| | | | |
|---|---|---|---|
| JP | 6-302840 A | * | 10/1994 |
| WO | 93/08606 | | 4/1993 |

OTHER PUBLICATIONS

Said et al, "Design, Fabrication, and Analysis of Crystalline Si–SiGe Heterostructure Thin–Film Solar Cells," IEEE Transactions on Electron Devices, vol. 46, No. 10, pp. 2103–2110, Oct. 1999.*

Brunches et al, Applied Physics Letters, vol. 77, No. 12, pp. 1822–1824, Sep. 18, 2000.*

A. I. Yakimov et al., *Normal–induced infrared photoconductivity in Si p–i–n diode with embedded Ge self-assembled quantum dots*, Applied Physics Letters, Sep. 6, 1999, 1413–1415.

J.L. Liu et al., *Intersubband absorption in boron–duped multiple Ge quantum dots*, Applied Physics Letters, Jan. 11, 1999, 185–187.

O. P. Pchelyakov et al., *Silicon–Germanium Nanostructures with Quantum Dots: Formation Mechanisms and Electrical Properties*, Semiconductors, vol. 34, No. 11, 1229–1247, (2000).

* cited by examiner

*Primary Examiner*—Alan Diamond
(74) *Attorney, Agent, or Firm*—Davidson, Davidson & Kappel, LLC

(57) ABSTRACT

A silicon-germanium thin-film solar cell having a quantum well structure as an active base layer within the space-charge region of the silicon p-n diode junction. The quantum well structure is composed of a sequence of silicon and germanium layers. In this manner, a highly absorbent base layer is produced in a silicon solar cell.

4 Claims, 1 Drawing Sheet

SILICON-GERMANIUM SOLAR CELL HAVING A HIGH POWER EFFICIENCY

The present application claims priority from German Application No. 10061192.3, filed Dec. 8, 2000, and hereby incorporated by reference herein.

BACKGROUND OF THE INVENTION

The present invention is directed to a silicon-germanium thin-film solar cell, as well as to a method for making such a solar cell.

The power efficiency of thin-film solar cells is determined by their absorptivity. However, silicon solar cells, whose film thickness has been reduced in the active regions for reasons of economics, also experience a reduction in the short-circuit current. To compensate for this, in turn, it is necessary to employ film systems having a highest possible absorptivity in the active region of the cell. Germanium, a material having a smaller band energy gap than silicon, has shown great promise for such a use. For quite some time, silicon-germanium compounds (SiGe) have been known for their outstanding properties, particularly with respect to their compatibility to pure silicon semiconductor technology.

The publication by Said et al. (Design, Fabrication, and Analysis of Crystalline Si-SiGe Heterostructure Thin-Film Solar Cells, IEEE Trans. on Electr. Dev., vol. 46, no. 10, p. 2103 (1999)), describes a solar cell that is constructed of Si/SiGe heterostructure films. A sharp increase in the power efficiency of the cell is expected from the use of hetero-films. However, increased germanium concentrations caused by the lattice mismatch of the germanium with respect to the silicon substrate, make it necessary to overcome the difficulty of epitaxial deposition of the layers. The dislocations resulting from the mismatching prove to be especially troublesome. The increasing dislocation density due, in particular, to so-called threading dislocations running at the surface, in the absorption region (p-n space-charge region) of the cell, causes the dark current to rise sharply; this leads directly to a decrease in the open terminal voltage (Voc) and to a poor fullness factor of the cell. Just as undesirable is the relaxation of grid bias, which has a direct, negative effect on the band structure and, thus, also on the power efficiency.

A special germanium film system is described in the publication by Brunhes et al. (Electroluminescence of Ge/Si Self-Assembled Quantum Dots Grown by Chemical Vapor Deposition, Appl. Phys. Lett., vol. 77, no. 12, p. 1822 (2000)). To manufacture light-emitting diodes, germanium is deposited in island patterns on the silicon substrate. The Ge islands raise the electro- and photoluminescence due to the resonance in the wavelength range of between 1.4–1.5 micrometers.

SUMMARY OF THE INVENTION

An object of the present invention is to improve the power efficiency of a silicon-germanium solar cell.

The present invention provides a silicon-germanium thin-film solar cell, wherein a quantum well structure composed of a sequence of silicon and germanium layers is arranged on a silicon substrate (1, 2, 3), within the space-charge region of the silicon p-n diode junction (6, 7).

The layer sequence may be constructed of a quantum well layer (41), a wetting layer (42), a Ge island layer (43), and of an Si cover layer (5), in multiple succession, which exhibits a quantum well structure having a smaller band gap than silicon. The sequence may include a 10 to 20-times repetition of the particular layers.

Also provided is a method, wherein the layer sequence is produced using molecular-beam epitaxy (MBE), low-pressure vapor-phase epitaxy (LP-CVD), or ultra high-vacuum vapor-phase epitaxy (UHV-CVD).

The present invention includes a silicon (Si)/silicon-germanium (Si/Ge) thin-film solar cell having a quantum well structure within the space-charge region of the silicon p-n diode junction. The quantum well structure is composed of a sequence of silicon and germanium layers. In this manner, a highly absorbent base layer is produced in a silicon-based solar cell.

On the one hand, the layer sequence of the quantum well structure is formed by the epitaxial growth of self-organizing germanium islands and/or by the deposition of a few atomic monolayers (ML) of silicon and germanium. On the other hand, it is formed from epitaxial $Si_nGe_m$ ultrathin superlattices (m ML Si; n ML Ge; 1 ML=0.14 nm) on a p-doped silicon substrate. The epitaxial methods used include molecular-beam epitaxy (MBE), low-pressure (LP-CVD) or ultra high-vacuum vapor-phase epitaxy (UHV-CVD).

A significant advantage of the present invention resides in the improved power efficiency in comparison to conventional silicon solar cells, due to a substantially enhanced absorptivity in the base, in particular within the longer-wave region ($\lambda > \lambda_g^{Si}$) of solar radiation. The above-mentioned, epitaxial deposition of SiGe quantum wells (QWs) and Ge islands, which grow in self-organized fashion in the base without the formation of mismatch dislocations at the Si/SiGe interface, causes the short-circuit current of the cell to rise, without the terminal voltage noticeably subsiding in comparison to the Si reference cell. The Si/SiGe layer sequence of the present invention, which is deposited on the Si substrate and is elastically strained (pseudomorphic), has a band gap which is smaller than that of Si and which absorbs the longer-wave photons below the Si band gap. Therefore, given an unvarying, active layer thickness, the short-circuit current of the cell rises sharply without any attendant, substantial increase in the dark current.

BRIEF DESCRIPTION OF THE DRAWINGS

The present invention is elucidated in the following in light of advantageous exemplary embodiments, reference being made to schematic figures in the drawing, which show.

DETAILED DESCRIPTION

Figure 1:
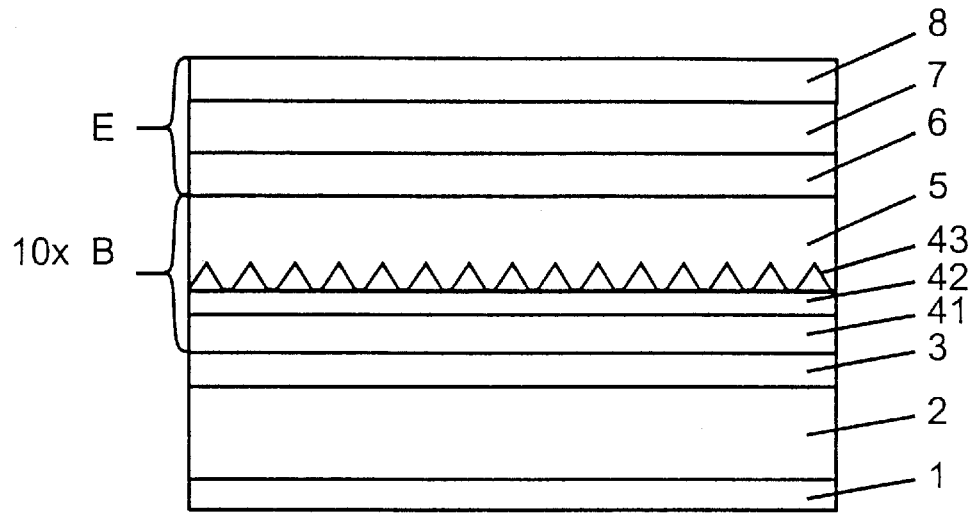
FIG. 1 a schematic layer construction of the Ge island solar cell.
Figure 2:
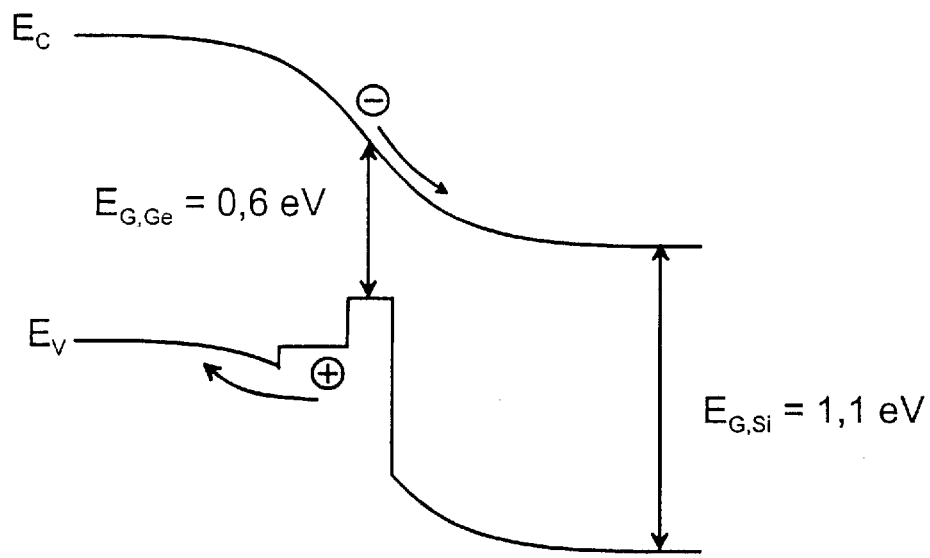
FIG. 2 a characteristic band pattern of the Ge island solar cell.

A first exemplary embodiment in accordance with FIG. 1 shows the layer construction of the Ge island solar cell on a silicon <100> substrate:

| Emitter layers | (8) Si, $n^{++} > 5 \cdot 10^{19}$ cm$^{-3}$ | 10 nm | |
|---|---|---|---|
| | (7) Si, $n^+ 5 \cdot 10^{18}$ cm$^3$ | 20 nm | |
| | (6) Si, $p^- 2 \cdot 10^{15}$ cm$^{-3}$ | 750 nm | Interface |
| Base layers approx. 10 X repetition of the | (5) Si, $p^- 2 \cdot 10^{15}$ cm$^{-3}$ | 15 nm | Si intermediate layer |
| | (43) Ge, $p^- 2 \cdot 10^{15}$ cm$^{-3}$ | 8 ML | germanium islands |
| | (42) Ge, $p^- 2 \cdot 10^{15}$ cm$^{-3}$ | 4 ML | wetting layer |
| | (41) SiGe$_{0.3}$ $p^- 2 \cdot 10^{15}$ cm$^{-3}$ | 16 ML | quantum well layer |

-continued

| base layers | | | | |
|---|---|---|---|---|
| | (3) Si, p⁻2·10¹⁵ cm⁻³ | 100 nm | | |
| | (2) Si,p | bulk | silicon <100>, ρ=10 Ωcm | |
| Substrate | (1) Si, p⁺⁺1·10¹⁹ –5·10²⁰ cm⁻³ | a few nm | rear side contact (implanted or diffused) | |

Note.:()...reference symbols of the figures are in parentheses; ML...monolayers

As a highly absorbent base layer, the active region is composed of two parts: a wider two-dimensional $Si_{1-x}Ge_x$QW layer 41 having a relatively low Ge concentration, for example 16 ML=2.2 nm $SiGe_{0.3}$, and a thinner layer having a high Ge concentration 42, for example 4 ML Ge, which is used as a wetting layer. This part is alternatively composed of two $Si_{1-x}Ge_x$ QW alloying layers (or $Ge_m/Si_{20}/Ge_m$, n=2.4) having different Ge concentrations, or of two $Si_mGe_n$ superlattices having a different, effective Ge concentration.

The second part is composed of three-dimensional Ge islands 43, which nucleate on the two-dimensionally grown Ge wetting layer when appropriate deposition parameters (MBE at approx. T=700 C) are selected, without producing any mismatch dislocations at the subjacent hetero-interfaces ($Si/SiGe_{0.3}$ or $SiGe_{0.3}/Ge$). The three-dimensional Ge islands 43 grow on wetting layer 42 in accordance with the so-called Stranski-Krastanov model, in which epitaxial island growth takes place in response to the energy conditions prevailing at the layer surface of the lattice-mismatched semiconductor layer systems. Temperature is an important parameter in layer fabrication, as it controls the diffusion mechanisms on the solid surface. The deposition preferably takes place within a temperature range extending from 500 to 700 C. Disposed between the weakly p-doped base layers ($2\ 10^{15}cm^{-3}$; see FIGS. 1, 3, 4) and the n-doped emitter layers is a 500–750 nm thick, p-doped Si interface, which spatially separates the p-n junction from the Si/SiGe hetero-junction, and also places the active layers at an optimal distance to the emitter surface (see K. Said et al., IEEE EDL 46, p. 2103 (1999)). The dopant levels are selected in such a way that the SiGe quantum wells are situated within the space-charge region.

What is claimed is:

1. A silicon-germanium thin-film solar cell comprising:

a silicon substrate; and a quantum well structure composed of a layer sequence of silicon and germanium layers arranged on the silicon substrate within a space-charge region of a silicon p-n diode junction;

wherein the layer sequence includes a quantum well layer, a wetting layer, a Ge island layer, and an Si cover layer, in multiple succession, so as to define a quantum well structure having a smaller band gap than silicon.

2. The solar cell as recited in claim 1 wherein the layer sequence is repeated 10 to 20-times.

3. A method for producing a silicon-germanium thin-film solar cell comprising a silicon substrate and a quantum well structure composed of a layer sequence of silicon and germanium layers arranged on the silicon substrate within a space-charge region of a silicon p-n diode junction, the method comprising the step of:

producing the layer sequence using molecular-beam epitaxy (MBE), low-pressure vapor-phase epitaxy (LP-CVD), or ultra high-vacuum vapor-phase epitaxy (UHV-CVD) wherein the layer sequence includes a quantum well layer, a wetting layer, a Ge island layer, and an Si cover layer, in multiple succession, so as to define a quantum well structure having a smaller band gap than silicon.

4. The method as recited in claim 3, wherein the layer sequence is repeated 10 to 20-times.

* * * * *